(12) United States Patent  
Chomei

(10) Patent No.: US 7,365,415 B2  
(45) Date of Patent: Apr. 29, 2008

(54) HIGH FREQUENCY SEMICONDUCTOR DEVICE

(75) Inventor: Kenichiro Chomei, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/539,884

(22) Filed: Oct. 10, 2006

(65) Prior Publication Data

US 2007/0290334 A1    Dec. 20, 2007

(30) Foreign Application Priority Data

Jun. 15, 2006    (JP)    ............................. 2006-165845

(51) Int. Cl.  
*H01L 23/528*    (2006.01)

(52) U.S. Cl. ...................... 257/664; 257/737; 257/786; 257/E23.153

(58) Field of Classification Search ................ 257/664, 257/737, 786, E23.153  
See application file for complete search history.

(56) References Cited

U.S. PATENT DOCUMENTS 6,175,287 B1 * 1/2001 Lampen et al. ............. 333/247  
6,700,076 B2 * 3/2004 Sun et al. .................... 174/262  
7,067,743 B2 * 6/2006 Tsukashima ................ 174/261

FOREIGN PATENT DOCUMENTS

JP    2004-214584    7/2004

* cited by examiner

*Primary Examiner*—Evan Pert  
*Assistant Examiner*—Victor A. Mandala, Jr.  
(74) *Attorney, Agent, or Firm*—Leydig, Voit & Mayer, Ltd.

(57) ABSTRACT

A semiconductor device has a mounting substrate and a semiconductor package mounted on the mounting substrate. The mounting substrate has a substrate body, input/output line conductors on the upper surface of the substrate body, a front-face grounding conductor on the upper surface of the substrate body, spaced from the input/output line conductors, and a lower surface grounding conductor formed on the lower surface of the substrate body and electrically connected to the front-face grounding conductor. The semiconductor package has input/output terminals electrically connected to end portions of the input/output line conductors, a grounding terminal electrically connected to the front-face grounding conductor, and a semiconductor element die-bonded on the grounding terminal and electrically connected to the input/output terminals. The input/output line conductors and the lower surface grounding conductor form microstrip line conductors; and the front-face grounding conductor surrounds the end portions of the input/output line conductors with arch shapes.

3 Claims, 19 Drawing Sheets

HIGH FREQUENCY SEMICONDUCTOR DEVICE

BACKGROUND OF THE INVENTION

1. Field of the Invention

The present invention relates to a semiconductor device adopting micro-strip line conductors as input line conductors of a high-frequency semiconductor element, and specifically to a high-gain semiconductor device that can reduce the reflection of input signals.

2. Background Art

A high-frequency semiconductor element for upper surface mounting that operates in a high-frequency band of MHz or GHz bands has been used. Normally, this high-frequency semiconductor element is mounted on a dielectric substrate composed of an epoxy resin or the like. For the input/output line conductor of the high-frequency semiconductor element, a micro-strip line conductor is often adopted from the point of view of ease of electrical design and area reduction (see, for example, Japanese Patent Laid-Open No. 2004-214584).

A conventional semiconductor device wherein a semiconductor package is mounted on a mounting substrate using a micro-strip line conductor in input/output line conductors will be described. FIG. 32 is a sectional view showing a conventional semiconductor device. FIG. 33 is a top view showing a conventional mounting substrate, and FIG. 34 is a top view showing a conventional semiconductor package.

The mounting substrate 11 has input/output line conductors 14 formed on the upper surface of a substrate body 13; an upper surface grounding conductor 15 formed on the upper surface of the substrate body 13 apart from the input/output line conductors 14; and a lower surface grounding conductor 17 formed on the lower surface of the substrate body 13 and electrically connected to the upper surface grounding conductor 15 through through-holes 16. The input/output line conductors 14 and the lower surface grounding conductor 17 form micro-strip line conductors.

The semiconductor package 12 has input/output terminals 21 composed of metal frames electrically connected to the end portion of the input/output line conductors 14, a grounding terminal 22 electrically connected to the upper surface grounding conductor 15, a high-frequency semiconductor element 24 die-bonded on the grounding terminal 22 and electrically connected to the input/output terminals 21 through bonding wires 23, and a molding resin 25 for sealing these.

The semiconductor package 12 is positioned in a self-aligning manner by the surface tension of solder when mounted on the mounting substrate 11. In order to make the surface tension work effectively, the conventional upper surface grounding conductor 15 is rectangular, and the upper surface grounding conductor 15 on the mounting substrate 11 is designed to be slightly larger (about 0.1 to 0.2 mm) than the grounding terminal 22 of the upper surface-mounted semiconductor package 12.

Here, a case wherein input signals are propagated into a conventional semiconductor device from the left of FIG. 32 is considered. Since the cross section of the micro-strip line conductor formed from the input/output line conductors 14 and the lower surface grounding conductor 17 is uniform from the cross section A-A' to cross section B-B', the input signals are propagated without reflection. The lower surface grounding conductor 17 and the input/output terminals 21 or the lower surface grounding conductor 17 and bonding wires 23 form the micro-strip line conductor from the cross section B-B' to cross section D-D'. Since the line impedance in this portion is different from the line impedance from the cross section A-A' to cross section B-B', slight reflection occurs; however, the propagation mode of input signals is same as the propagation mode of the micro-strip line conductor, and serious problems do not normally arise.

However, the grounding upper surface shifts vertically from the lower surface grounding conductor 17 to the grounding terminal 22. Therefore, the advancing direction of the input signals changes from the lateral direction to the upward direction of FIG. 22, the propagation mode of input signals is no longer the same as the propagation mode of the micro-strip line conductor. Consequently, there was a problem wherein input signals were significantly reflected at the cross section D-D', reducing the gain of the semiconductor device.

SUMMARY OF THE INVENTION

To solve the problem as described above, it is an object of the present invention to reduce the reflection of input signals, and obtain a high-gain semiconductor device.

According to one aspect of the present invention, a high-frequency semiconductor device has a mounting substrate and a semiconductor package mounted on the mounting substrate, wherein the mounting substrate has a substrate body, input/output line conductors formed on the upper surface of the substrate body, a front-face grounding conductor formed on the upper surface of the substrate body apart from the input/output line conductors, and a lower surface grounding conductor formed on the lower surface of the substrate body and electrically connected to the front-face grounding conductor; the semiconductor package has input/output terminals electrically connected to the end portions of the input/output line conductors, a grounding terminal electrically connected to the front-face grounding conductor, and a high-frequency semiconductor element die-bonded on the grounding terminal and electrically connected to the input/output terminals; the input/output line conductors and the lower surface grounding conductor form micro-strip line conductors; and the front-face grounding conductor has a shape to surround the end portions of the input/output line conductors in arch shapes.

According to the present invention, the reflection of input signals can be reduced, and a high-gain semiconductor device can be obtained.

Other and further objects, features and advantages of the invention will appear more fully from the following description.

DETAILED DESCRIPTION OF THE PREFERRED EMBODIMENTS

First Embodiment

Figure 1:
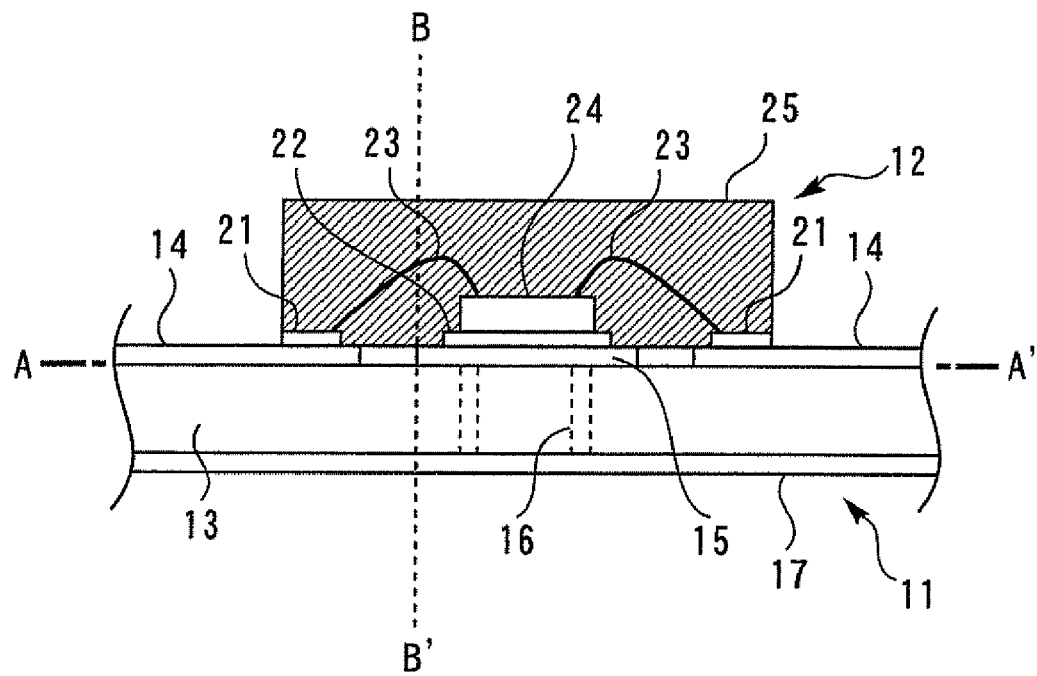
FIG. 1 is a vertical sectional view showing a semiconductor device according to the first embodiment of the present invention.
Figure 2:
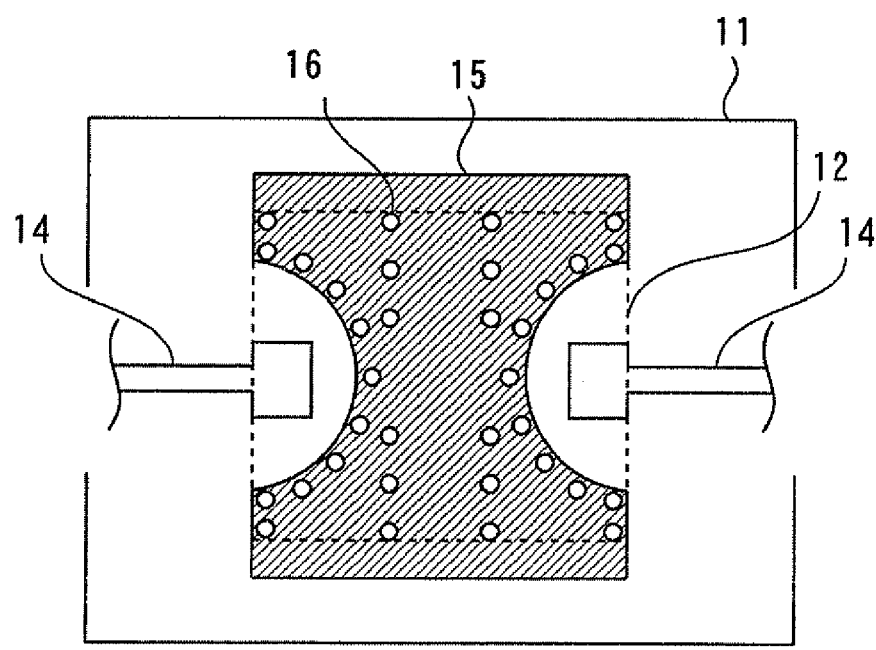
FIG. 2 is a lateral sectional view along line A-A' in FIG. 1

FIG. 1 is a vertical sectional view showing a semiconductor device according to the first embodiment of the present invention. FIG. 2 is a lateral sectional view along line A-A' in FIG. 1. A semiconductor package 12 is mounted on the mounting substrate 11.

The mounting substrate 11 has input/output line conductors 14 formed on the upper surface of a substrate body 13; an upper surface grounding conductor 15 formed on the upper surface of the substrate body 13 apart from the input/output line conductors 14; and a lower surface grounding conductor 17 formed on the lower surface of the substrate body 13 and electrically connected to the upper surface grounding conductor 15 through through-holes 16. The input/output line conductors 14 and the lower surface grounding conductor 17 form micro-strip line conductors.

The semiconductor package 12 has input/output terminals 21 composed of metal frames electrically connected to the end portion of the input/output line conductors 14, a grounding terminal 22 electrically connected to the upper surface grounding conductor 15, a high-frequency semiconductor element 24 die-bonded on the grounding terminal 22 and electrically connected to the input/output terminals 21 through bonding wires 23, and a molding resin 25 for sealing these.

In the present invention, the upper surface grounding conductor 15 has a shape surrounding the input/output terminals 21 in an arch shape (semicircular, oval, or straight line or curved line simulating these). By thus surrounding the input/output terminals 21 by the upper surface grounding conductor 15, the reflection of input signals at the end surface (B-B' cross section) of the upper surface grounding conductor 15 can be reduced, and this is further effective by surrounding the input/output terminals 21 in an arch shape. Therefore, by the present invention, a high-gain semiconductor device can be obtained.

Figure 3:
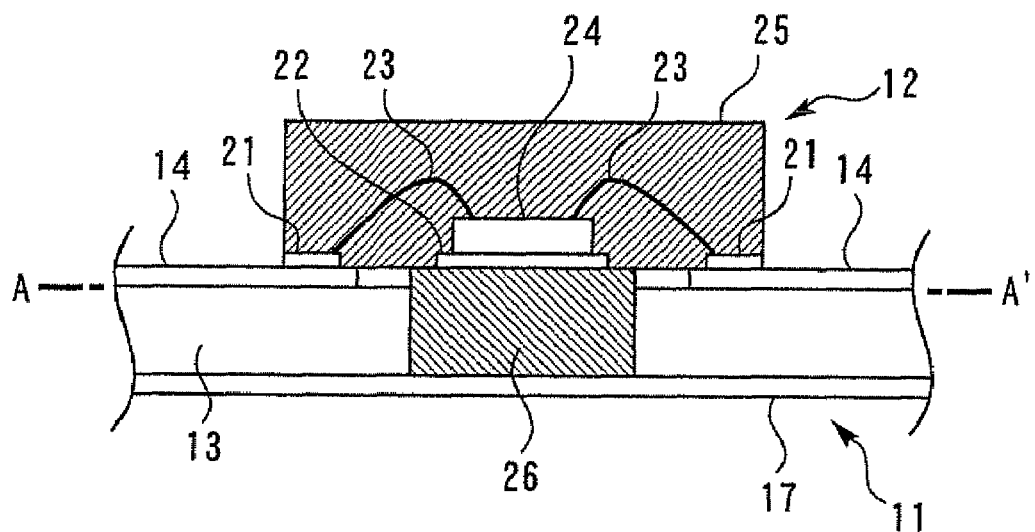
FIG. 3 is a vertical sectional view showing a semiconductor device for calculation corresponding to a conventional art.
Figure 4:
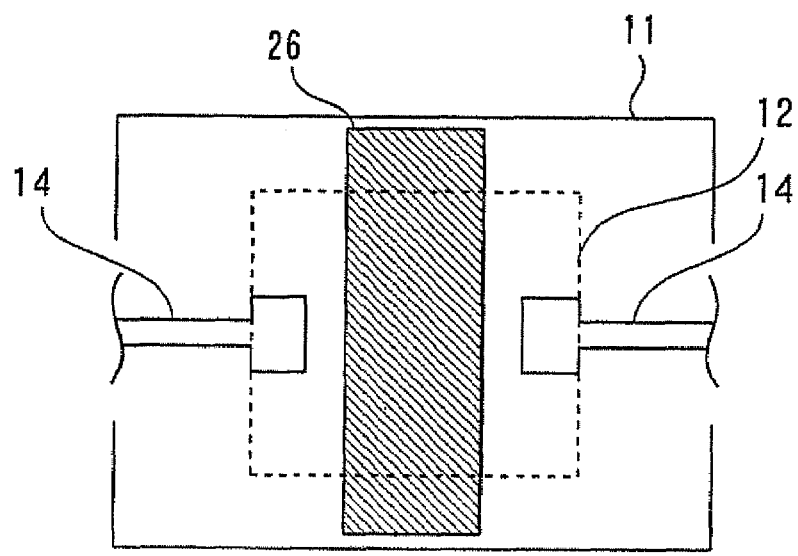
FIG. 4 is a lateral sectional view along line A-A' in FIG. 3.
Figure 5:
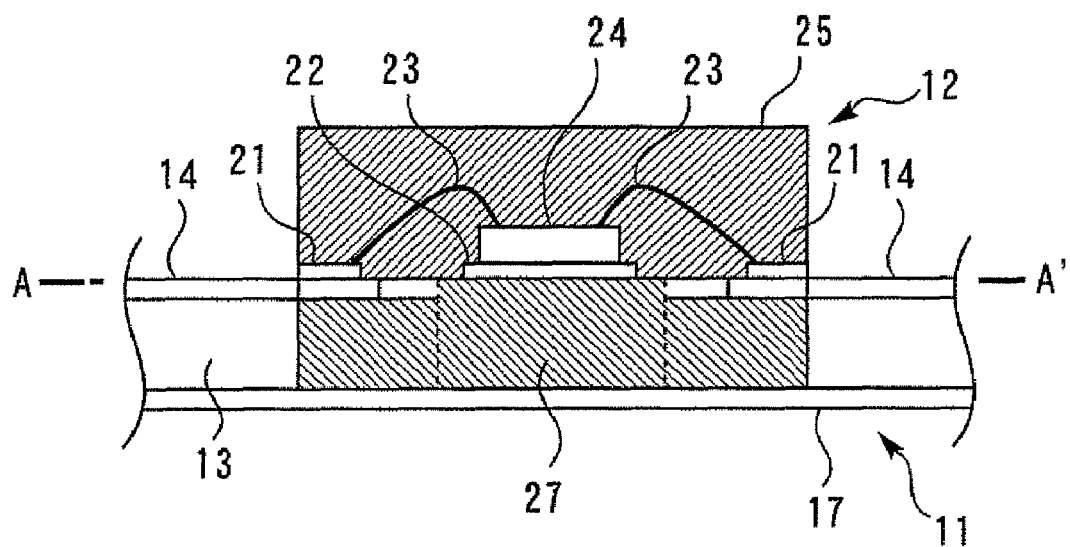
FIG. 5 is a vertical sectional view showing a semiconductor device for calculation corresponding to the first embodiment of the present invention.
Figure 6:
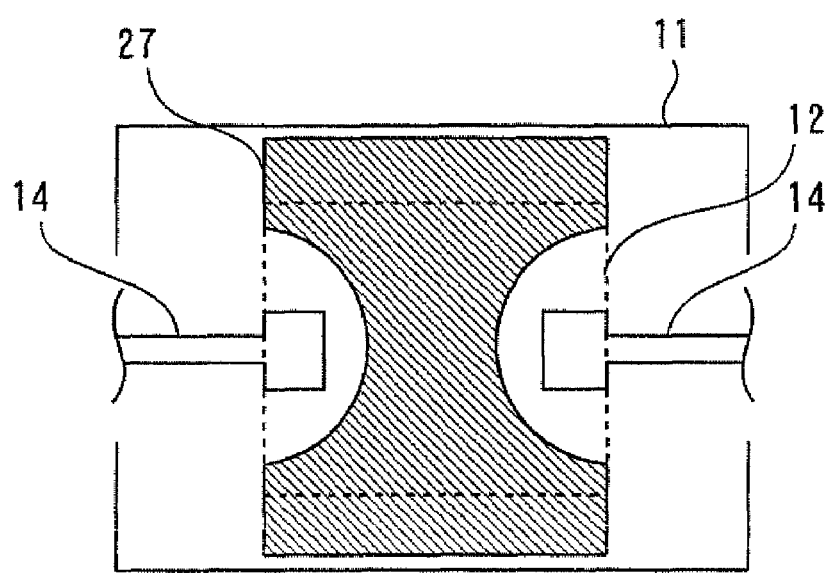
FIG. 6 is a lateral sectional view along line A-A' in FIG. 5.
Figure 7:
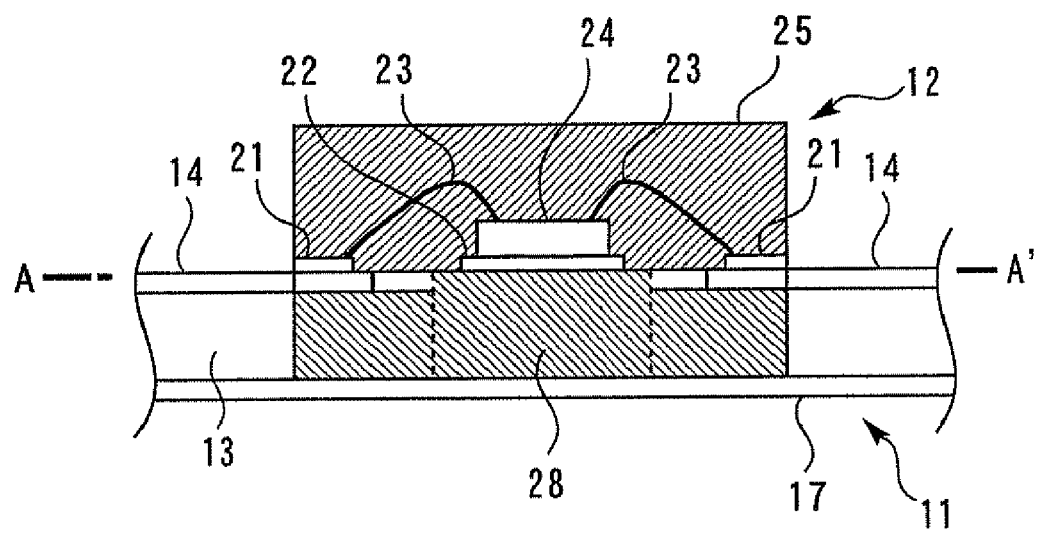
FIG. 7 is a vertical sectional view showing a comparative semiconductor device for computation.
Figure 8:
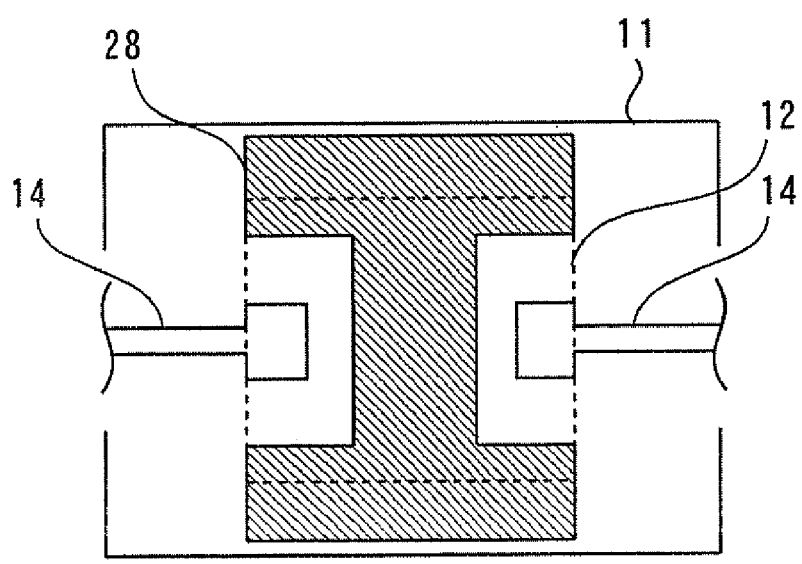
FIG. 8 is a lateral sectional view along line A-A' in FIG. 7.

To verify the effect of the present invention, simulation was performed by changing the shapes of the upper surface grounding conductor 15. FIG. 3 is a vertical sectional view showing a semiconductor device for calculation corresponding to a conventional art; FIG. 4 is a lateral sectional view along line A-A' in FIG. 3. FIG. 5 is a vertical sectional view showing a semiconductor device for calculation corresponding to the first embodiment of the present invention; and FIG. 6 is a lateral sectional view along line A-A' in FIG. 5. FIG. 7 is a vertical sectional view showing a comparative semiconductor device for computation, and FIG. 8 is a lateral sectional view along line A-A' in FIG. 7. In these semiconductor devices for computation, in order to reduce the amount of computation, each of the upper surface grounding conductors 15 is integrated with through-holes 16 to be a metallic body, which is made to be grounding conductor 26 to 28, respectively.

Figure 9:
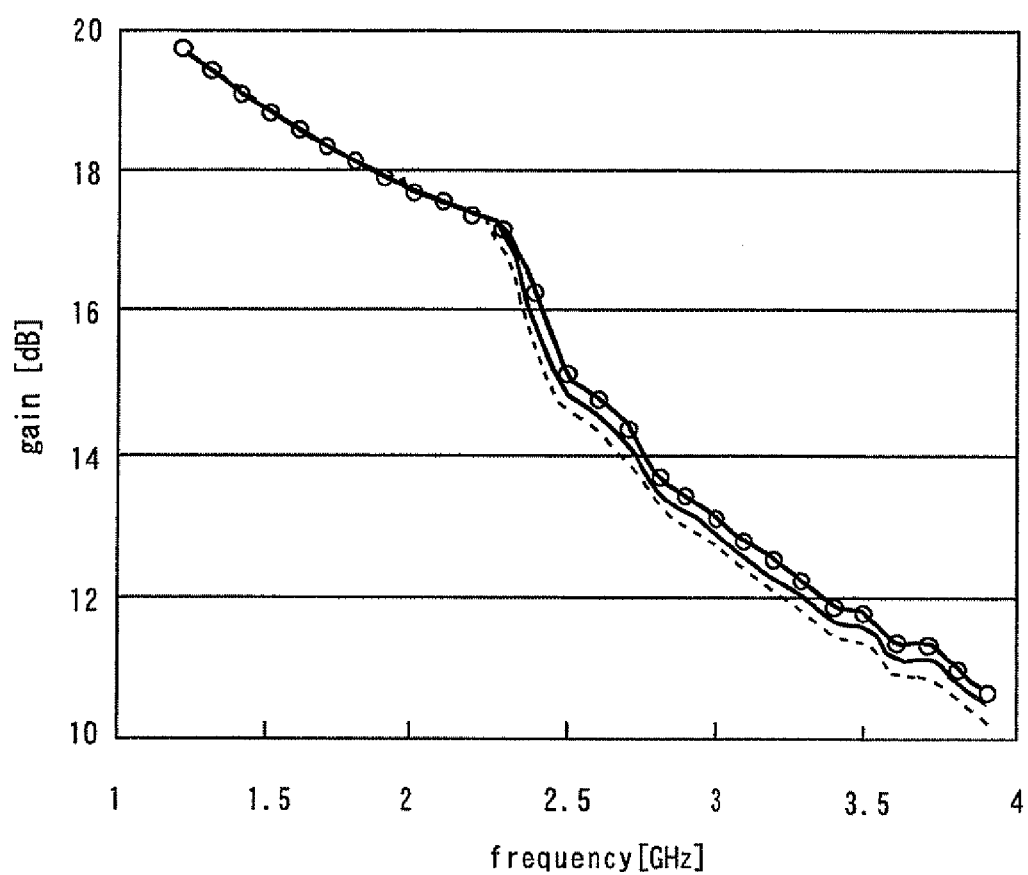
FIG. 9 is a graph showing the results of frequency dependence computations of maximum stable gain and maximum available power gain in the first embodiment.

FIG. 9 is a graph showing the results of frequency dependence computations of maximum stable gain and maximum available power gain in the first embodiment. In FIG. 9, the dotted line corresponds to the device shown in FIGS. 3 and 4, the solid line corresponds to the device shown in FIGS. 5 and 6 and the solid line with circles corresponds to the device shown in FIGS. 7 and 8. Specifically, S parameters of the semiconductor packages obtaining by performing electromagnetic field computation for the above-described semiconductor devices for computation and separately obtained S parameters of the semiconductor elements are synthesized using a circuit simulator to compute S parameters of the semiconductor elements mounted on the substrate. As a result of computation, it was known that according to the first embodiment, the maximum available power gain of semiconductor devices of 2.3 GHz or more was improved by about 0.5 dB compared with conventional art.

Second Embodiment

Figure 10:
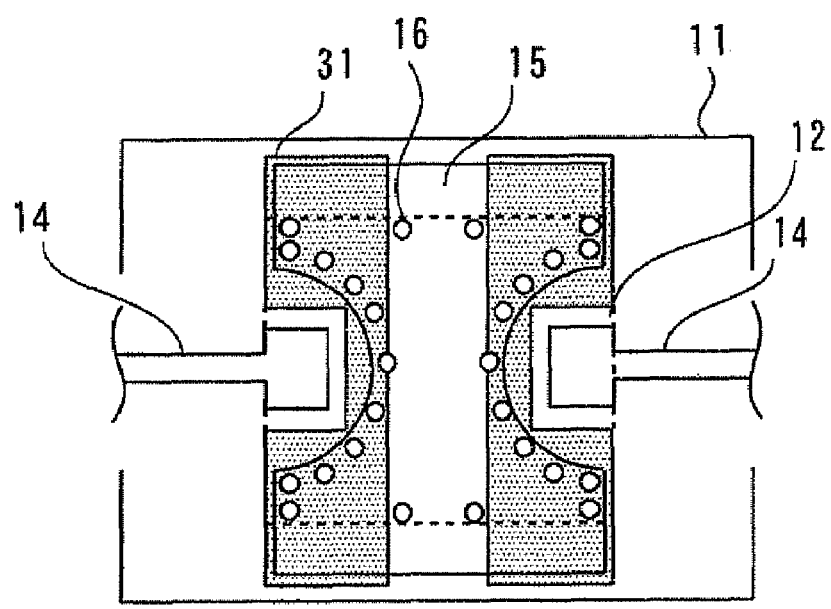
FIG. 10 is a lateral sectional view showing a semiconductor device according to the second embodiment of the present invention.

FIG. 10 is a lateral sectional view showing a semiconductor device according to the second embodiment of the present invention. Rectangular soldering masks 31 surrounding the end portions of input/output line conductors 14 are installed on the upper surface grounding conductor 15. Other configurations are identical to those of the first embodiment. Thereby the mounting location can be accurately decided.

Figure 11:
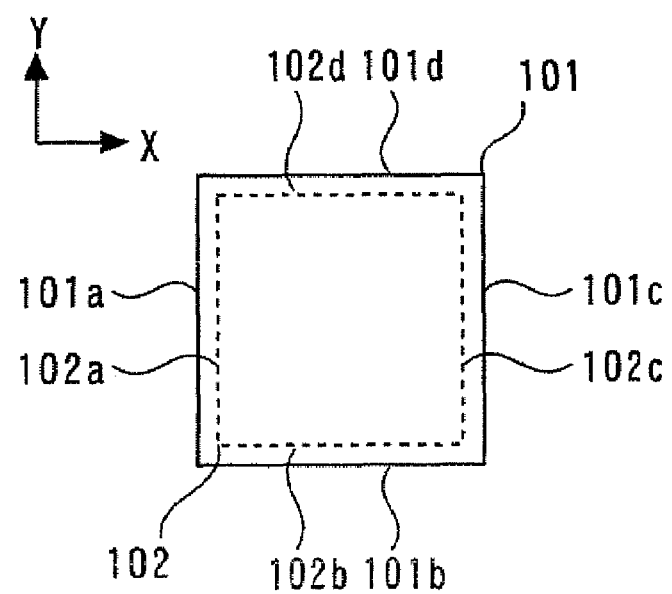
FIG. 11 is a diagram showing the overlapping of the land in the mounting substrate side and the pad of the surface-mounted parts.

The effect of the second embodiment will be described in detail. In general, surface-mounted parts are mounted on a mounting substrate by reflow using cream solder. At this time, mounting positioning is performed by surface tension of the solder melted by reflow. FIG. 11 is a diagram showing the overlapping of the land in the mounting substrate side and the pad of the surface-mounted parts. Mounting positions in the X direction are decided by the balance of surface tension of solder in the right side 101c of the land 101 and the right side 102c of the pad 102, and surface tension of solder in the left side 101a of the land 101 and the left side 102a of the pad 102. In the same way, mounting positions in the Y direction are decided by the balance of surface tension of solder in the lower side 101b of the land 101 and the lower side 102b of the pad 102, and surface tension of solder in the upper side 101d of the land 101 and the upper side 102d of the pad 102. Since positioning of mounting is thus performed, to perform accurate positioning of surface-mounted parts, it is preferable that the pad and the land have sides parallel to each other.

Therefore, in the second embodiment, since the semiconductor package 12 can have parallel sides in the joining surface with the grounding terminal 22 by installing rectangular soldering masks 31 even if the upper surface grounding conductor 15 has the shape to surround the input/output terminals 21 in an arch shape, the mounting positions can be accurately decided.

Third Embodiment

Figure 12:
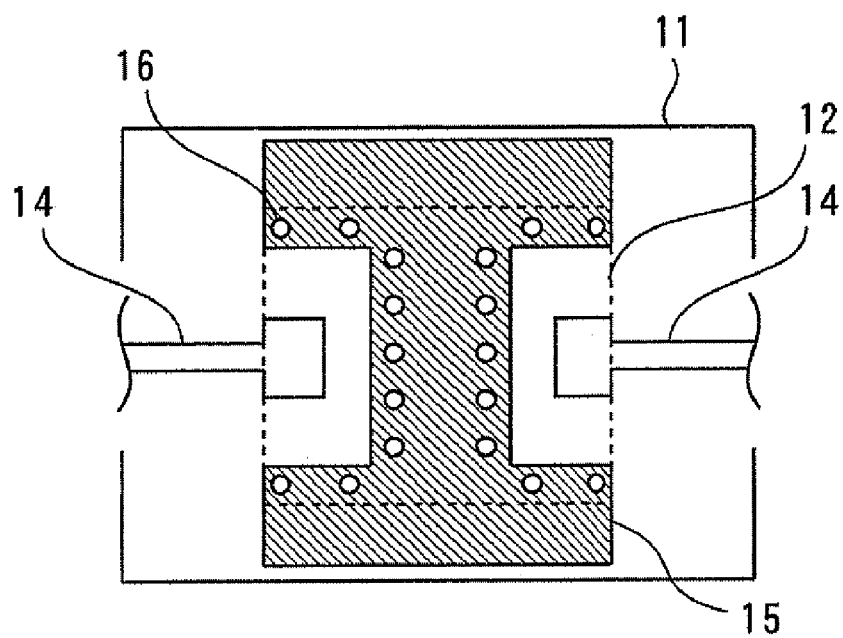
FIG. 12 is a top view showing a mounting substrate according to the third embodiment of the present invention.
Figure 13:
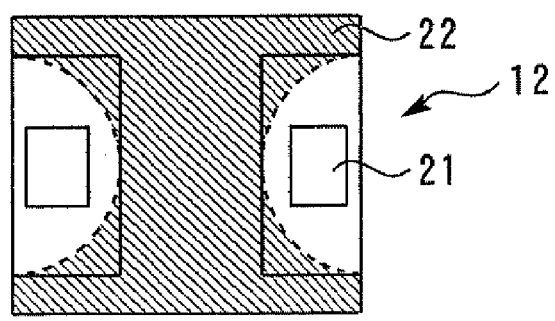
FIG. 13 is a bottom view showing a semiconductor package according to the third embodiment of the present invention.
Figure 14:
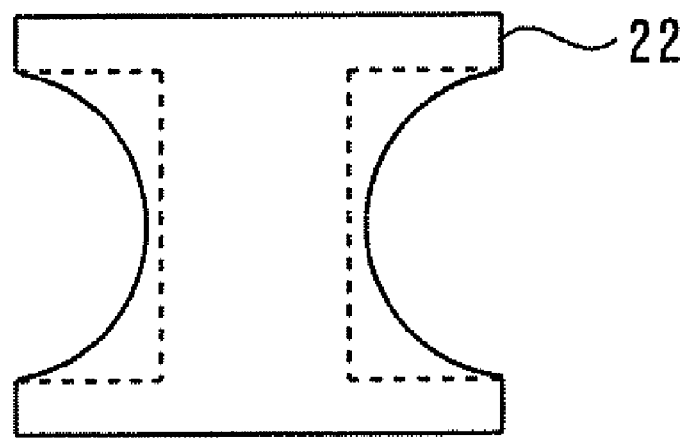
FIGS. 14 to 17 are top view, side view, perspective view viewed from the bottom, and perspective view viewed from the top of a grounding terminal according to the third embodiment of the present invention, respectively.
Figure 15:
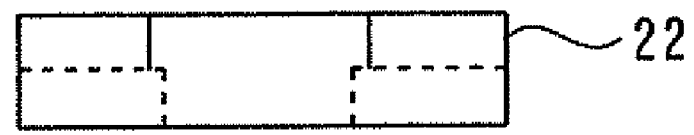
Figure 16:
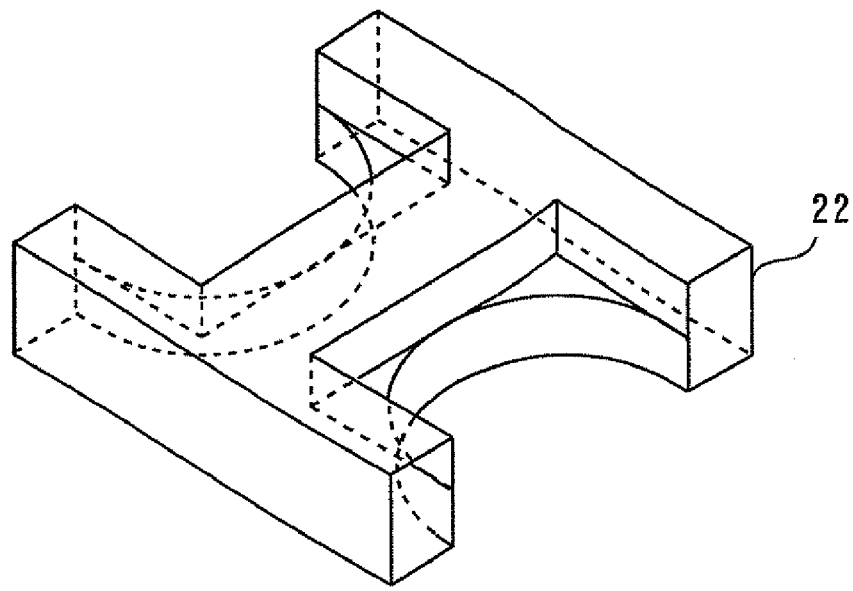
Figure 17:
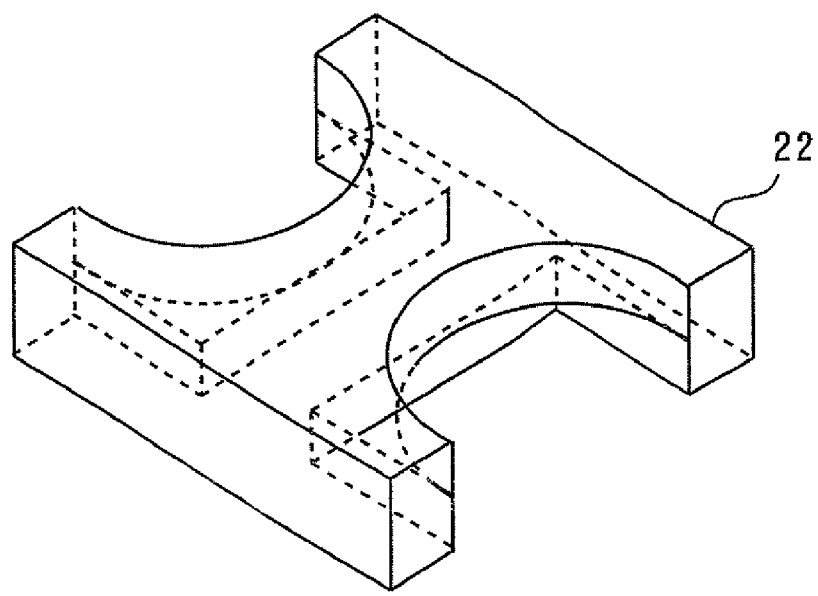
Figure 18:
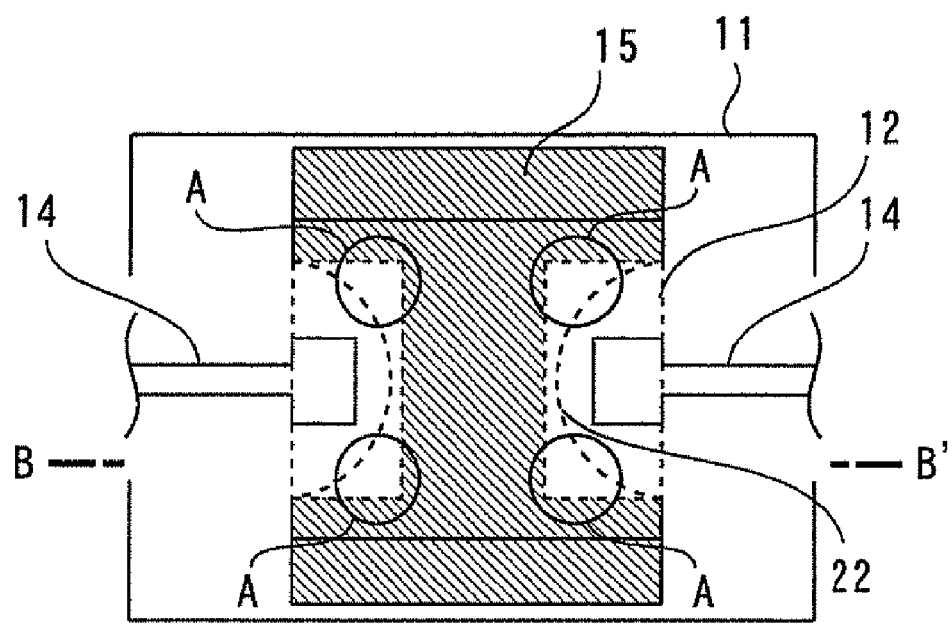
FIG. 18 is a top view showing a semiconductor device according to the third embodiment of the present invention.
Figure 19:
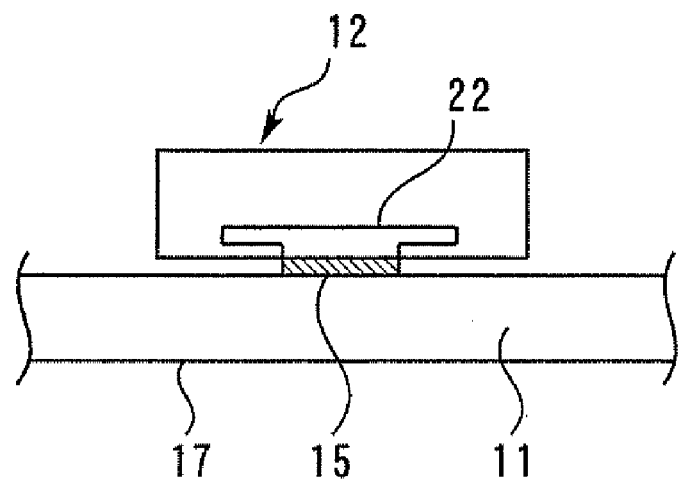
FIG. 19 is a sectional view along line B-B' in FIG. 18.

FIG. 12 is a top view showing a mounting substrate according to the third embodiment of the present invention. FIG. 13 is a bottom view showing a semiconductor package according to the third embodiment of the present invention. FIGS. 14 to 17 are top view, side view, perspective view viewed from the bottom, and perspective view viewed from the top of a grounding terminal according to the third embodiment of the present invention, respectively. FIG. 18 is a top view showing a semiconductor device according to the third embodiment of the present invention; and FIG. 19 is a sectional view along line B-B' in FIG. 18.

Thus, the grounding terminal 22 is a rectangle surrounding the end portions of input/output line conductors 14 in the connecting surface to the upper surface grounding conductor 15, which is the shape surrounding the end portions of input/output line conductors 14 in an arch shape inside the semiconductor package 12. The grounding terminal 22 having such a shape can be fabricated by a half-etching process, a pressing process or other processing methods. Thereby, since the grounding terminal 22 and the upper surface grounding conductor 15 are rectangular in the connecting surfaces, the surface tension of solder works effectively, and thus the mounting position of the semiconductor package 12 can be accurately decided.

Normally, the thickness of the portion of the mounting substrate 11 involved in high-frequency transmission is about 0.4 mm, and is sufficiently thinner than the space wavelength of, for example, a glass-epoxy substrate at 3 GHz (dielectric constant: 4.4). Also normally, the thickness of the frame for a mold package is as thin as about 0.2 mm. Therefore, electromagnetic waves do not penetrate into the portion surrounded by the lower surface grounding conductor 17 of the mounting substrate 11 and the grounding terminal 22 of the semiconductor package 12 (portion A in FIG. 18). Therefore, the effect identical to the effect of the first embodiment can be expected.

Figure 20:
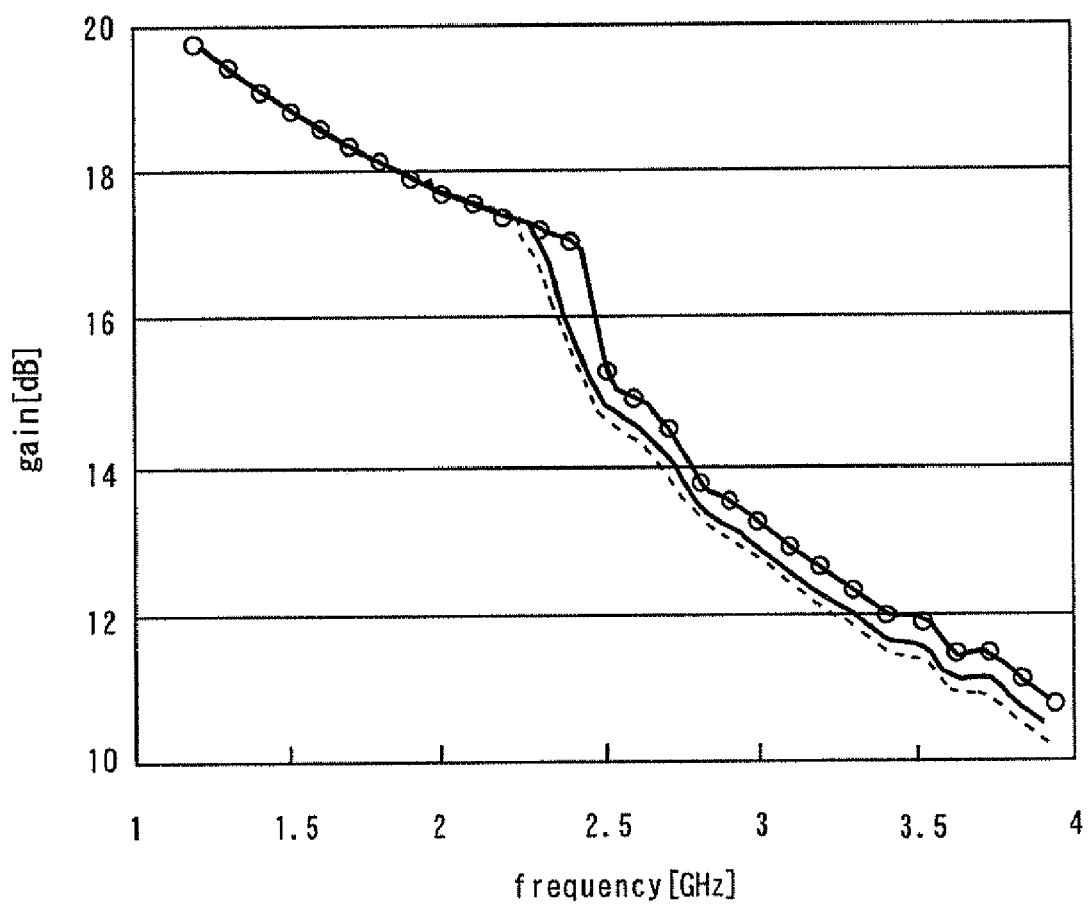
FIG. 20 is a graph showing the results of frequency dependence computations of maximum stable gain and maximum available power gain in the first embodiment of the present invention.

FIG. 20 is a graph showing the results of frequency dependence computations of maximum stable gain and maximum available power gain in the first embodiment of the present invention. The method for computation is the same as in the case of FIG. 9. In FIG. 20, the dotted line corresponds to the semiconductor device shown in FIG. 4 on which a conventional semiconductor package is mounted, the solid line corresponds to the semiconductor device shown in FIG. 8 on which a conventional semiconductor package is mounted, and the solid line with circles corresponds to the semiconductor device shown in FIG. 8 on which a semiconductor package according to the third embodiment is mounted. As a result of computation, it was known that according to the third embodiment, the maximum available power gain of semiconductor devices of 2.3 GHz or more was improved by about 0.5 dB compared with conventional art as in the first embodiment.

Fourth Embodiment

Figure 21:
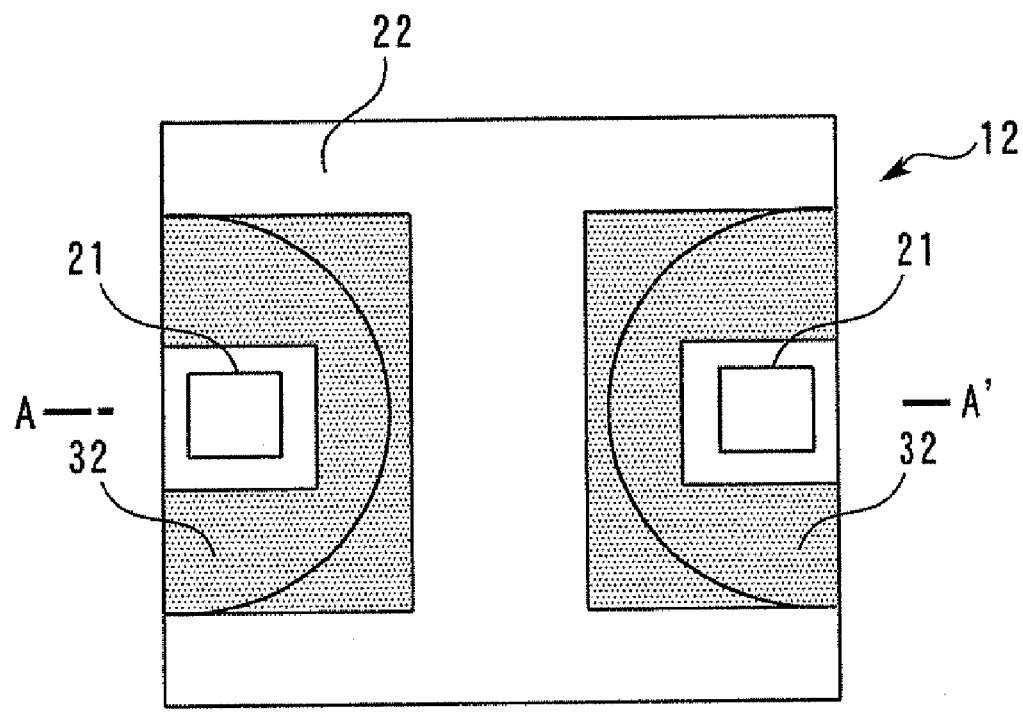
FIG. 21 is a bottom view showing a semiconductor package according to the fourth embodiment of the present invention.
Figure 22:
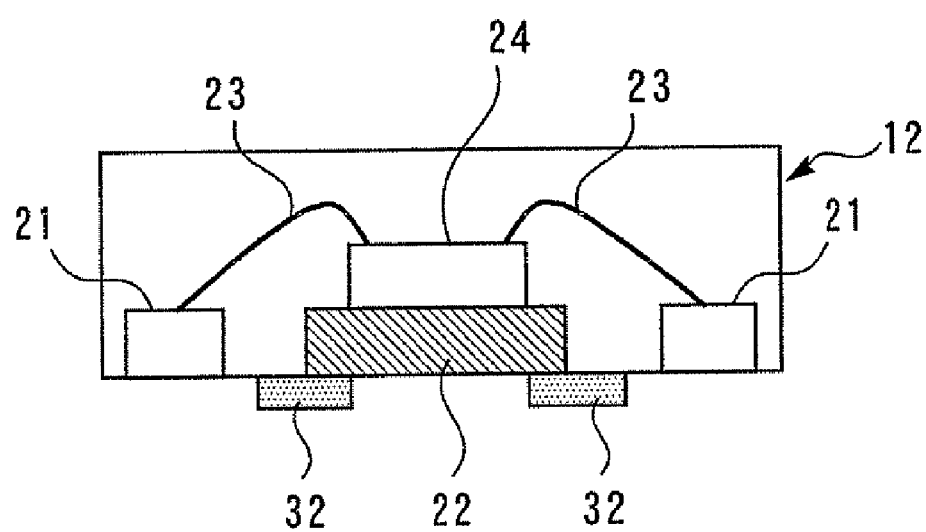
FIG. 22 is a sectional view along line A-A' in FIG. 21.
Figure 23:
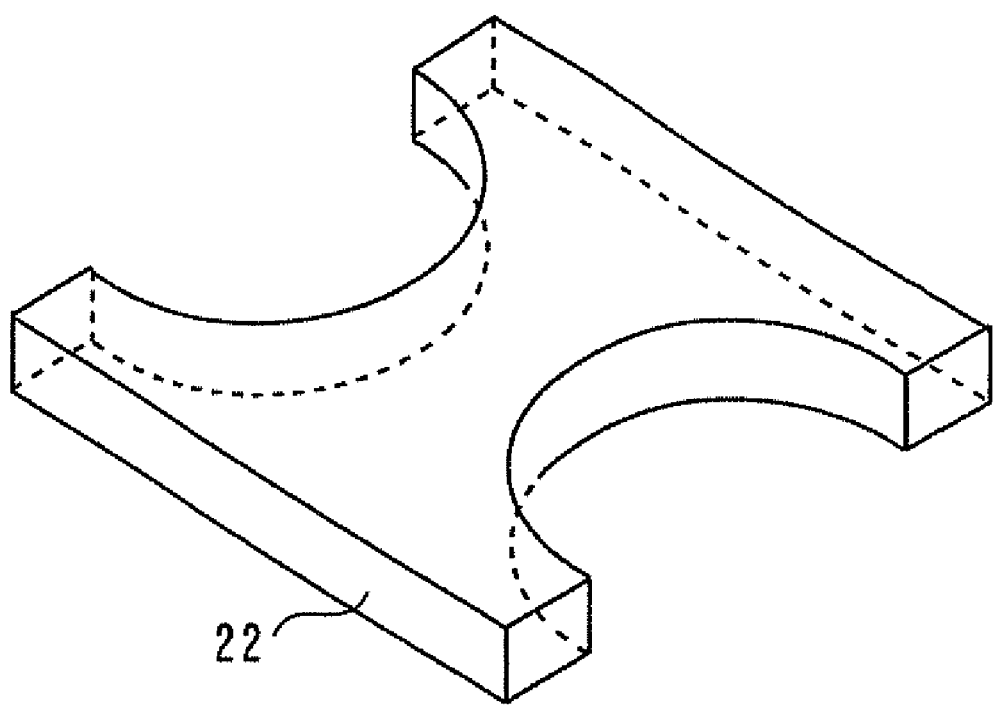
FIG. 23 is a perspective view showing a grounding terminal according to the fourth embodiment of the present invention.

FIG. 21 is a bottom view showing a semiconductor package according to the fourth embodiment of the present invention; FIG. 22 is a sectional view along line A-A' in FIG. 21; and FIG. 23 is a perspective view showing a grounding terminal according to the fourth embodiment of the present invention. As these drawings show, the grounding terminal 22 has a shape surrounding the end portions of the input/output line conductors 14 in an arch shape. Thereby, the reflection of input signals can be reduced, and a high-gain semiconductor device can be obtained. Rectangular soldering masks 32 surrounding the end portions of the input/output line conductors 14 are installed underneath the grounding terminal 22. Thereby, the joining surface with the upper surface grounding conductor 15 can have parallel sides, and thus the mounting positions can be accurately decided.

Fifth Embodiment

Figure 24:
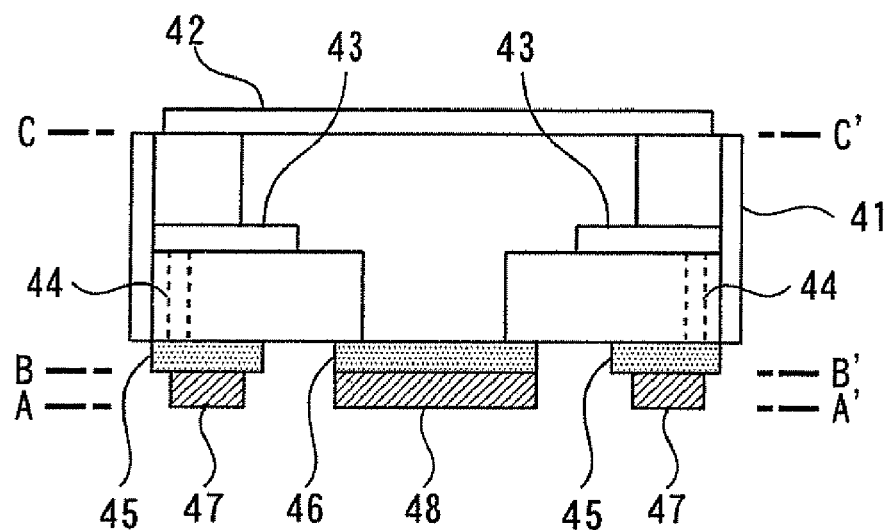
FIG. 24 is a vertical sectional view showing a multilayer conductor substrate according to the fifth embodiment of the present invention.
Figure 25:
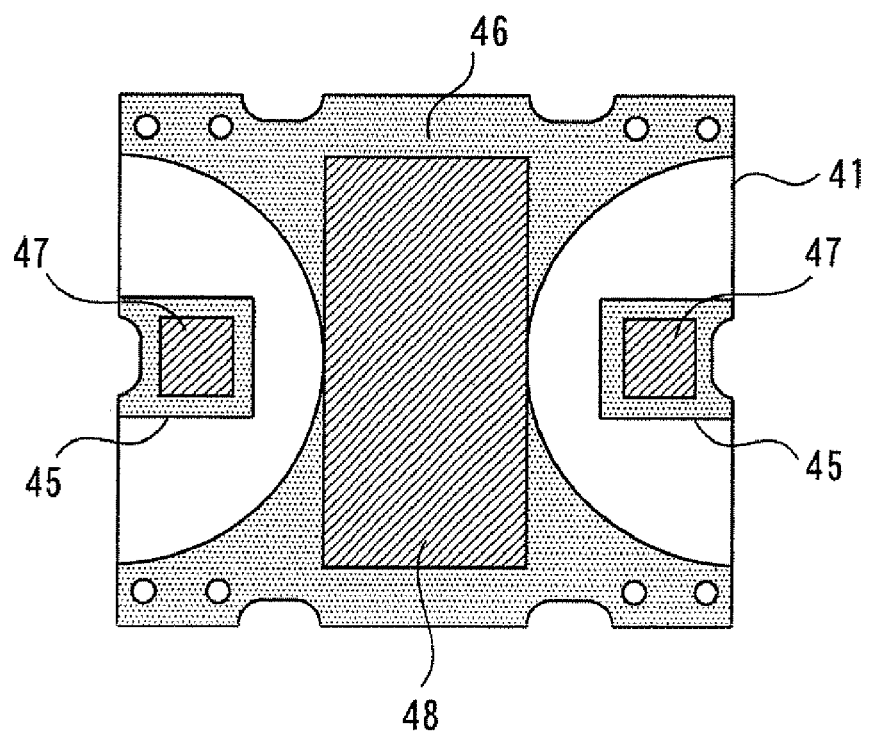
FIG. 25 is a lateral sectional view along line A-A' in FIG. 24.
Figure 26:
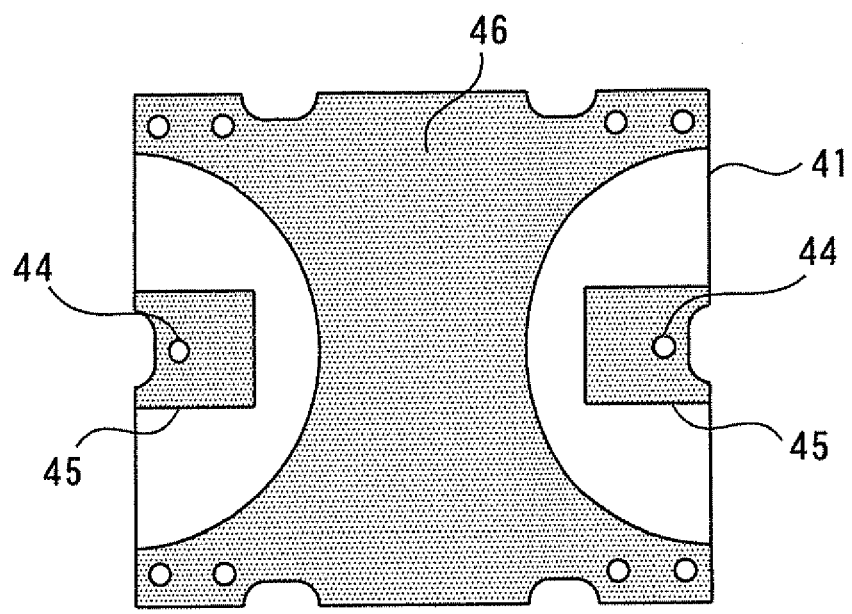
FIG. 26 is a lateral sectional view along line B-B' in FIG. 24.
Figure 27:
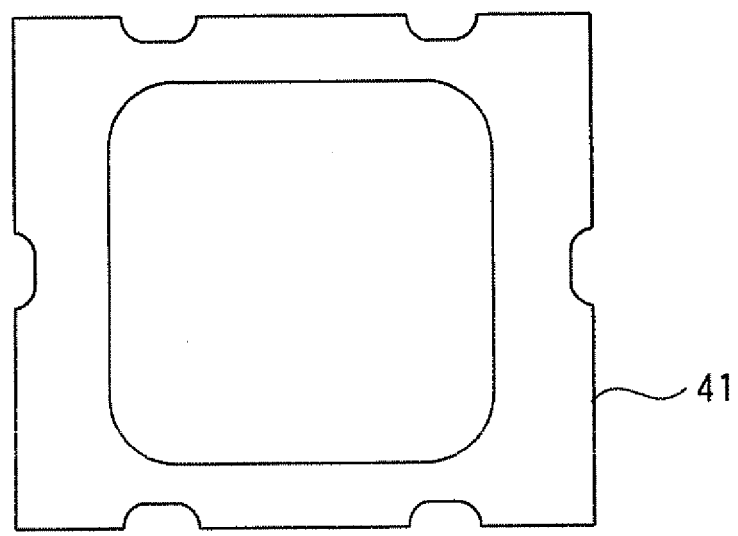
FIG. 27 is a lateral sectional view along line C-C' in FIG. 24.

The fifth embodiment is an example wherein a semiconductor package is fabricated by a multilayer dielectric substrate. FIG. 24 is a vertical sectional view showing a multilayer conductor substrate according to the fifth embodiment of the present invention; FIG. 25 is a lateral sectional view along line A-A' in FIG. 24; FIG. 26 is a lateral sectional view along line B-B' in FIG. 24; and FIG. 27 is a lateral sectional view along line C-C' in FIG. 24. The semiconductor package 41 is hollow, and a cover 42 attached placed thereon. In the semiconductor package 41, upper layer metallization layers 43 are installed, and electrically connected to the lower surface metallization layers 45 on the lower surface of the semiconductor package 41 through through-holes 44. On the lower surface of the semiconductor package 41, a lower surface metallization layer 46 to be connected to the upper surface grounding conductor of the mounting substrate is formed.

On the lower surface of the lower surface metallization layers 45, input/output terminals 47 to be electrically connected to the end portions of the input/output line conductors of the mounting substrate are formed. The lower surface metallization layer 46 has a shape surrounding the end portions of the input/output line conductors in an arch shape. Underneath the lower surface metallization layer 46, a thin rectangular metallic body 48 is installed. Thereby, the same effect as the effect of the third embodiment can be obtained.

Sixth Embodiment

Figure 28:
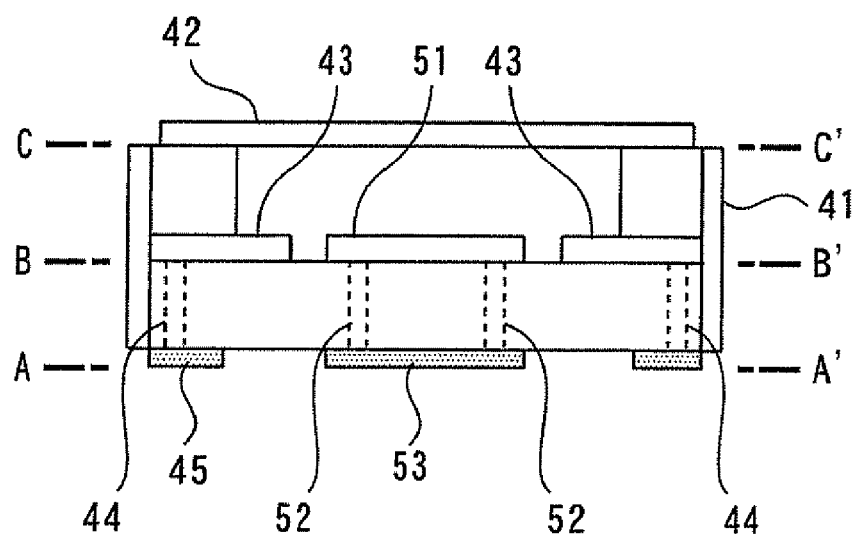
FIG. 28 is a vertical sectional view showing a multilayer dielectric substrate according to the sixth embodiment of the present invention.
Figure 29:
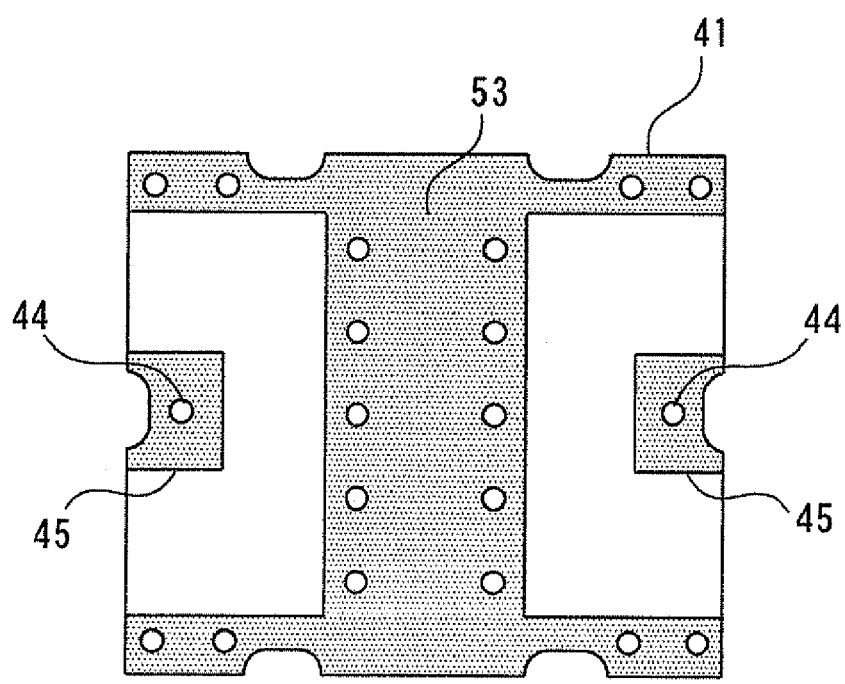
FIG. 29 is a lateral sectional view along line A-A' in FIG. 28.
Figure 30:
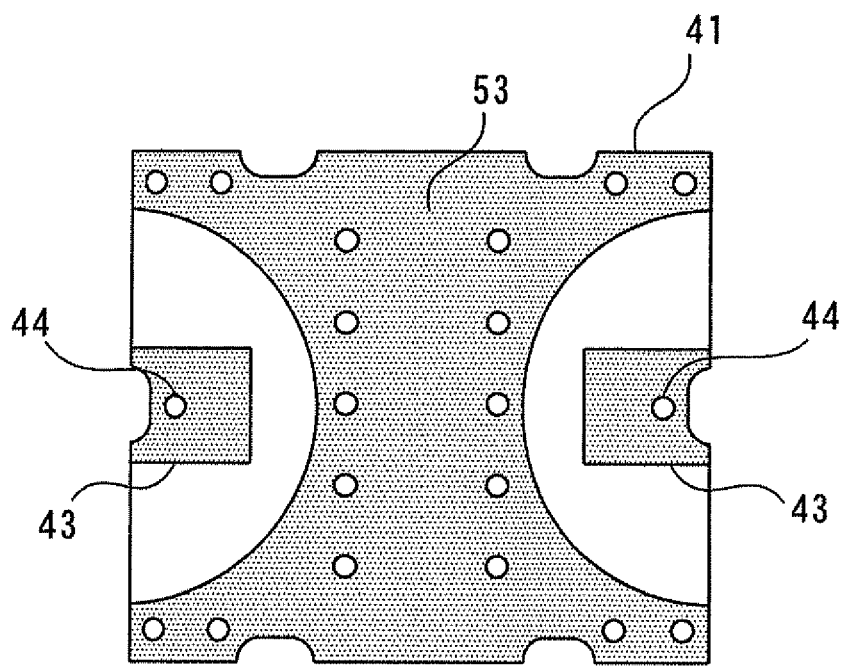
FIG. 30 is a lateral sectional view along line B-B' in FIG. 28.
Figure 31:
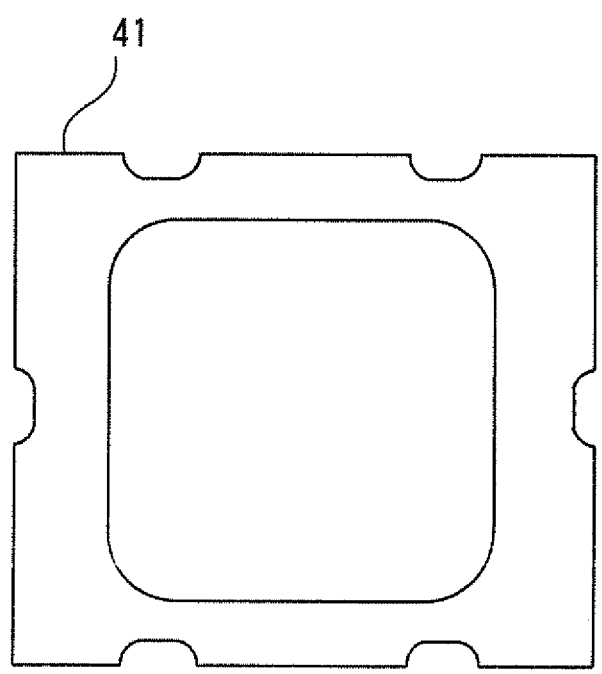
FIG. 31 is a lateral sectional view along line C-C' in FIG. 28.
Figure 32:
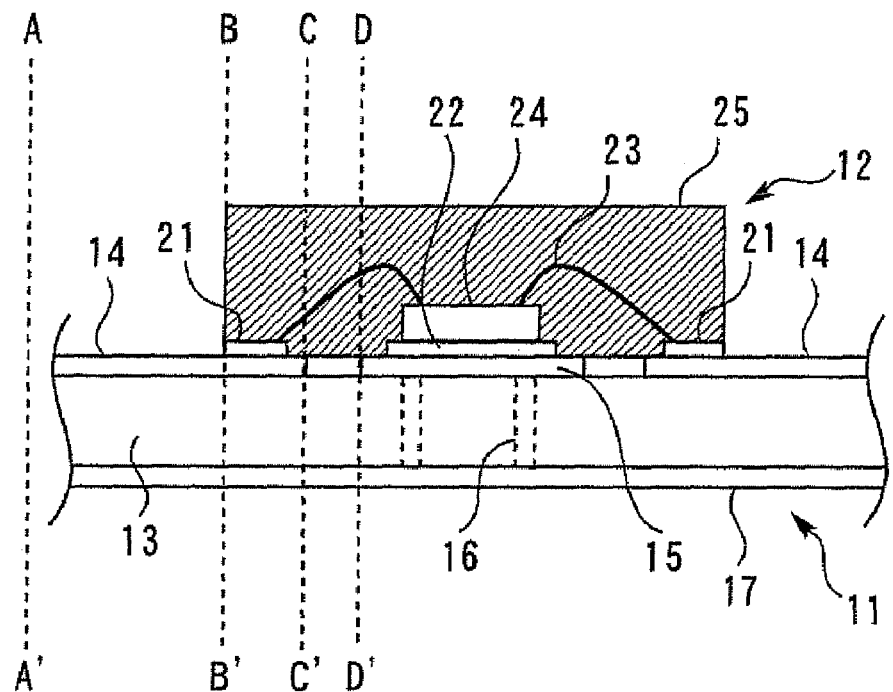
FIG. 32 is a sectional view showing a conventional semiconductor device.
Figure 33:
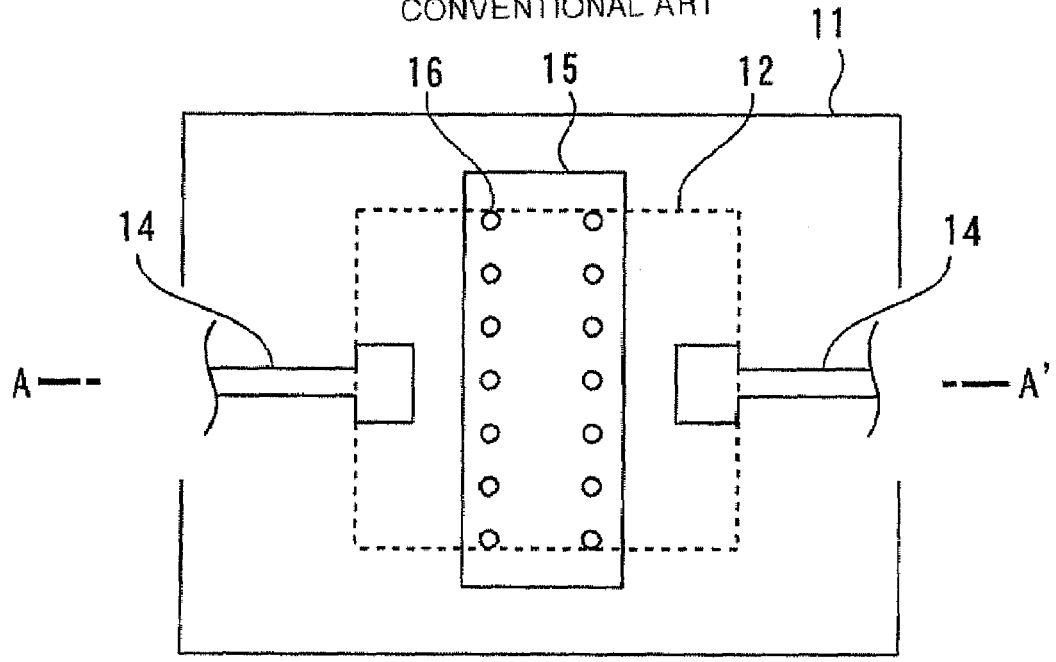
FIG. 33 is a top view showing a conventional mounting substrate.
Figure 34:
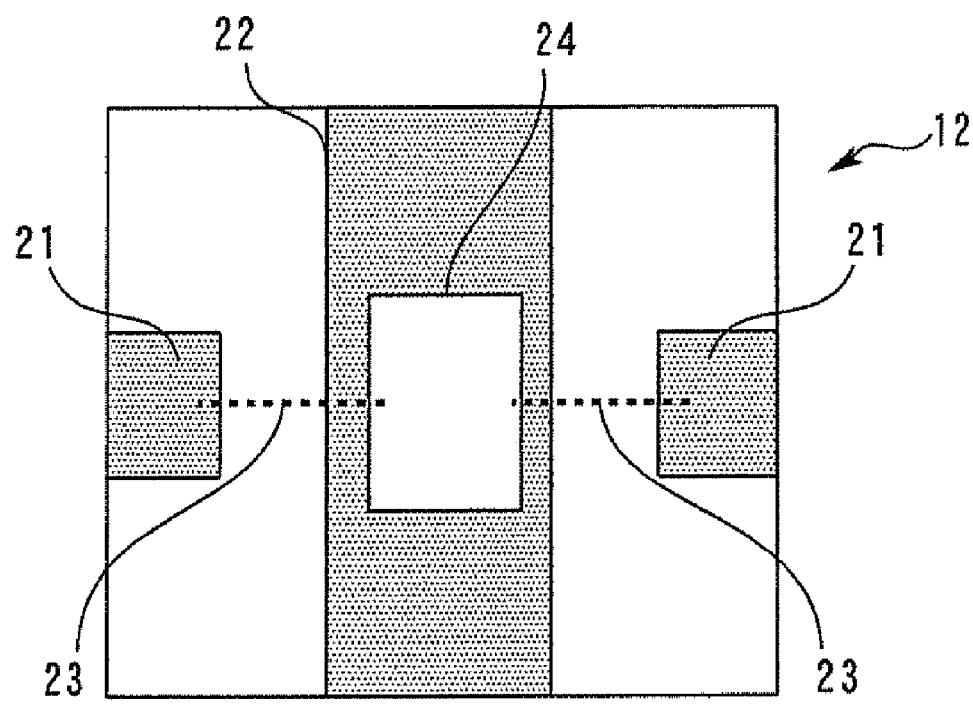
FIG. 34 is a top view showing a conventional semiconductor package.

The sixth embodiment is an example wherein a semiconductor package is fabricated by a multilayer dielectric substrate. FIG. 28 is a vertical sectional view showing a multilayer dielectric substrate according to the sixth embodiment of the present invention; FIG. 29 is a lateral sectional view along line A-A' in FIG. 28; FIG. 30 is a lateral sectional view along line B-B' in FIG. 28; and FIG. 31 is a lateral sectional view along line C-C' in FIG. 28. In the semiconductor package 41, an upper-layer metallization layer 51 is installed, and electrically connected to the lower surface metallization layer 53 on the lower surface of the semiconductor package 41 through through-holes 52. The upper-layer metallization layer 51 has a shape to surround the end portions of the input/output line conductors in an arch shape, and the lower surface metallization layer 53 is rectangular. Other configurations are identical to the configurations of the fifth embodiment. Thereby, the same effect as the effect of the third embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-165845, filed on Jun. 15, 2006 including specification, claims, drawings and summary, on which the Convention priority of the present application is based, are incorporated herein by reference in its entirety.

The invention claimed is:

1. A semiconductor device comprising:
   a mounting substrate; and
   a semiconductor package mounted on said mounting substrate, wherein
      said mounting substrate has a substrate body, input/output line conductors on an upper surface of said substrate body, an front-face grounding conductor on the upper surface of said substrate body, spaced from said input/output line conductors, a lower surface grounding conductor on a lower surface of said substrate body and electrically connected to said front-face grounding conductor, and rectangular soldering masks surrounding end portions of said input/output line conductors and located on said front-face grounding conductor,
      said semiconductor package has input/output terminals electrically connected to the end portions of said input/output line conductors, a grounding terminal electrically connected to said front-face grounding conductor, and a semiconductor element die-bonded on said grounding terminal and electrically connected to said input/output terminals,
      said input/output line conductors and said lower surface grounding conductor form micro-strip line conductors, and
      said front-face grounding conductor surrounds the end-portions of said input/output line conductors in arc shapes.

2. A semiconductor device comprising:
   a mounting substrate; and
   a semiconductor package mounted on said mounting substrate, wherein
      said mounting substrate has a substrate body, input/output line conductors on the upper surface of said substrate body, a front-face grounding conductor on an upper surface of said substrate body, spaced from said input/output line conductors, and a lower surface grounding conductor on a lower surface of said substrate body and electrically connected to said front-face grounding conductor,
      said semiconductor package has input/output terminals electrically connected to end portions of said input/output line conductors, a grounding terminal electrically connected to said front-face grounding conductor, and a semiconductor element die-bonded on said grounding terminal and electrically connected to said input/output terminals,
      said input/output line conductors and said lower surface grounding conductor form micro-strip line conductors, and
      said grounding terminal is a rectangle surrounding the end portions of said input/output line conductors at a connecting surface to said upper surface grounding conductor, and surrounding the end portions of said input/output line conductors with arc shapes inside said semiconductor package.

3. A semiconductor device comprising:
   a mounting substrate; and
   a semiconductor package mounted on said mounting substrate, wherein
      said mounting substrate has a substrate body, input/output line conductors on an upper surface of said substrate body, a front-face grounding conductor formed on the upper surface of said substrate body spaced from said input/output line conductors, a lower surface grounding conductor on the lower surface of said substrate body and electrically connected to said front-face grounding conductor, and rectangular soldering masks surrounding end portions of said input/output line conductors and located underneath said grounding terminal,
      said semiconductor package has input/output terminals electrically connected to the end portions of said input/output line conductors, a grounding terminal electrically connected to said front-face grounding conductor, and a semiconductor element die-bonded on said grounding terminal and electrically connected to said input/output terminals,
      said input/output line conductors and said lower surface grounding conductor form micro-strip line conductors, and
      said grounding terminal surrounds the end portions of said input/output line conductors with arc shapes.

\* \* \* \* \*